United States Patent [19]
Leon

[11] Patent Number: 5,966,034
[45] Date of Patent: Oct. 12, 1999

[54] METHOD AND DEVICE FOR THE FILTERING OF A PULSE SIGNAL

[75] Inventor: Jean-Francois Leon, Gardanne, France

[73] Assignee: STMicroelectronics S.A., Gentilly, France

[21] Appl. No.: 09/087,478

[22] Filed: May 29, 1998

[30]     Foreign Application Priority Data

May 30, 1997 [FR]   France ................................. 97 06703

[51] Int. Cl.$^6$ ...................................................... H03K 5/00
[52] U.S. Cl. ............................ 327/34; 327/551; 327/31; 327/552; 327/166
[58] Field of Search ................................... 327/551, 552, 327/34, 37, 31, 311, 166, 165

[56]             References Cited

U.S. PATENT DOCUMENTS

| | | | |
|---|---|---|---|
| 3,753,135 | 8/1973 | Kastner et al. ......................... | 329/106 |
| 4,675,545 | 6/1987 | Takahaski ............................... | 327/166 |
| 4,926,072 | 5/1990 | Hyodo ...................................... | 372/34 |
| 5,043,653 | 8/1991 | Foster et al. ........................... | 327/552 |
| 5,132,691 | 7/1992 | Hauschultz ............................. | 342/159 |
| 5,874,839 | 2/1999 | Wakimoto ................................ | 327/34 |

FOREIGN PATENT DOCUMENTS

3435097 A1  4/1985  Germany ......................... H03K 5/05

OTHER PUBLICATIONS

The Art of Electronics, Horowitz et al., Digital Electronics; Sequential Functions Available As ICs, 1980, p. 358, Cambridge University Press.

*Primary Examiner*—Dinh T. Le
*Attorney, Agent, or Firm*—Allen, Dyer, Doppelt, Milbrath & Gilchrist, P.A.

[57]             ABSTRACT

In a pulse filtering device, the pulse signal is sampled to enable the counting of this signal by an asynchronous counter. A pulse of calibrated duration is generated when the counting reaches a predetermined number.

19 Claims, 4 Drawing Sheets

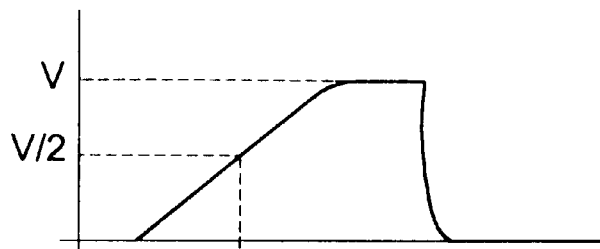
FIG. 1a.
(PRIOR ART)
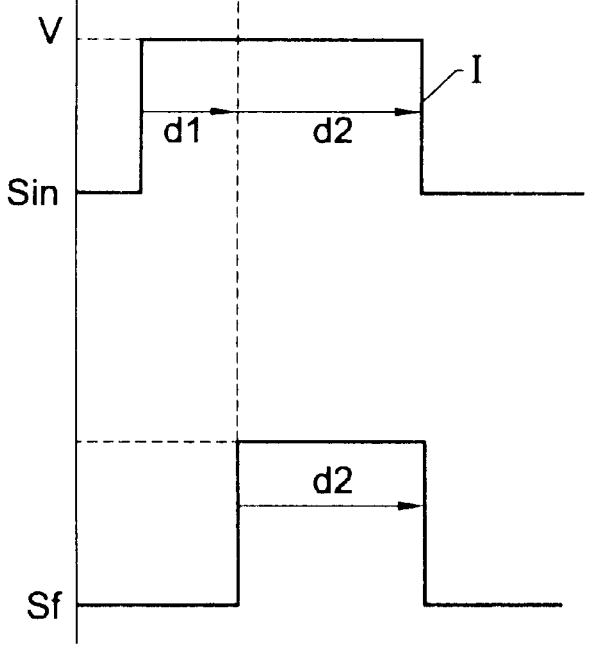
FIG. 1b.
(PRIOR ART)
FIG. 1c.
(PRIOR ART)

METHOD AND DEVICE FOR THE FILTERING OF A PULSE SIGNAL

FIELD OF THE INVENTION

The present invention relates to electronics, and more particularly, to a method and device for processing a pulse signal.

BACKGROUND OF THE INVENTION

In electronic circuits with serial transmission interfaces, it is often necessary to filter the input signal to eliminate the parasitic pulses that may result with excessively small pulse widths. If these parasitic pulses are not filtered, they could cause malfunctioning of the electronic circuit. Indeed, the appearance of a pulse could activate a particular operation in the circuit, but the pulse width would not be sufficient to ensure that the operation runs to its complete extent. Furthermore, it is not desirable that a pulse caused by noise on the line should be capable of activating a function of the electronic circuit. This is why a filtering device is usually provided. This filtering device may include an RC lowpass filter.

The use of an RC lowpass filter of this kind nevertheless has a few drawbacks. The resistance and capacitance values of the RC filter may vary from one electronic circuit to another, owing to variations inherent to the method of manufacture used. These values of resistance and capacitance will also vary with the level of the ambient temperature at which the electronic circuit functions.

The cutoff value of the RC filter depends directly on the amplitude of the pulse. This is shown in FIGS. 1a to 1c in the appended drawings. In these figures, the input signal is referenced Sin and the filtered output signal is referenced Sf. FIG. 1a shows the charging and discharging at the terminals of the capacitor when a pulse I with an amplitude V appears on the input signal Sin (FIG. 1b). The cutoff value d1 of the RC lowpass filter is given by V/2. The filtered signal Sf (FIG. 1c) at the output of the filter has a pulse shortened by the duration d1 corresponding to the time taken to charge the capacitor from zero to V/2.

The filtered signal thus has a shortened pulse duration d2 in the figure. A shortening of this kind of the pulse width is highly inconvenient in practice. Indeed, the system may find itself with a filtered pulse width d2 smaller than the cutoff value d1. For example, if there is an RC filter to filter the pulse widths smaller than 300 ns (d1=300 ns) and if the input pulse has a width of 310 ns, the filtered pulse will have no more than a width d2 equal to 10 ns, leading to an erratic operation of the electronic circuit. With a filtering system of this kind, it is therefore necessary to set a specification for the user requiring that pulses be presented with a width d far greater than the cutoff value d1 of the filter, to take account of the zone of erratic operation.

If d1 is the cutoff value equal to the minimum width of a pulse for accurate operation of the electronic circuit, the specification set a minimum width dmin=2·d1. The three operating zones are then the following, for an input pulse with a width d:

d<d1: completely filtered pulse,
d1<d<2·d1: zone of erratic operation, and
d>2·d1: zone of accurate operation.

Finally, it has been seen that the cutoff value d1 of the filter depends on the amplitude V of the pulse. In one transmission system using the variation of the amplitude of the pulse as an information transmission system, a filtering operation of this kind is therefore not applicable since it would dictate cutoff values that differ according to the amplitude of the pulse received.

SUMMARY OF THE INVENTION

An object of the invention is a filtering device that overcomes the above noted drawbacks.

In the invention, it is proposed to sample the input pulse signal so that it can be counted by an asynchronous counter and to generate a pulse of calibrated duration when the counted value reaches a determined number. With this procedure, there are no more than two zones of operation. An input pulse for which the counting of the samples does not reach the determined number is filtered. An input pulse for which the counting of the samples reaches at least the determined number is converted into a pulse of calibrated duration. This calibrated duration is independent of the input pulse. It is preferably generated by a synchronous counter.

With a filtering method of this kind, there is no longer any dependence on the manufacturing method or the ambient temperature or even on the amplitude of the input pulse. A filtering method of this kind provides a response particularly suited to the transmission of information elements using the variation of the amplitude of the pulses.

As characterized, the invention relates to a device for the filtering of a pulse input signal Sin. According to the invention, the filtering device comprises a sampling circuit receiving, at an input, the pulse input signal Sin and delivering, at an output, a sampled signal. The filtering device also includes an asynchronous counter receiving the sampled signal as a clock signal, a detection circuit to provide a detection signal when the contents of the asynchronous counter are greater than or equal to a predetermined number n0, and a circuit for the transmission of a calibrated pulse dc controlled by the detection signal. Preferably, the circuit for the transmission of a calibrated pulse comprises a synchronous counter.

BRIEF DESCRIPTION OF THE DRAWINGS

Other features and advantages of the invention are described in detail in the following description, given by way of a non-restrictive indication, with reference to the appended drawings, of which:

FIGS. 1a to 1c which have already been commented upon illustrate the filtering by an RC type lowpass filter as in the prior art;

DETAILED DESCRIPTION OF THE PREFERRED EMBODIMENTS

Figure 2:
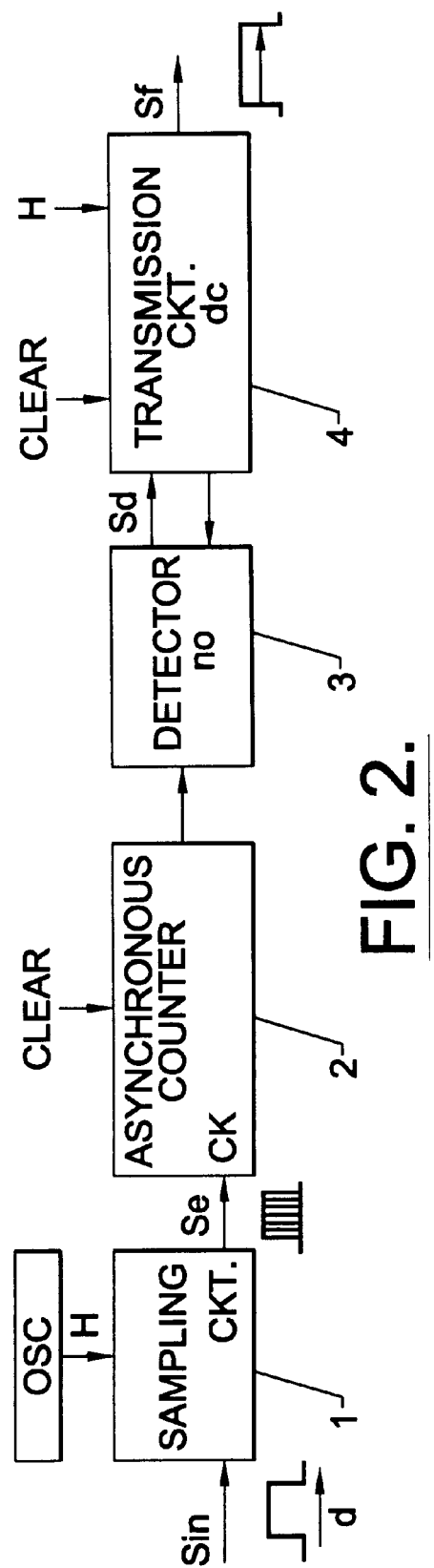
FIG. 2 shows a functional diagram of a filtering device according to the invention.

FIG. 2 shows a functional diagram of a device for the filtering of a pulse signal according to the invention. The device includes a sampling circuit 1 receiving, at an input, the pulse signal to be filtered referenced Sin and a stable clock signal H given in a standard way by an oscillator OSC of the electronic circuit. The sampling circuit 1 delivers a sampled signal Se at an output. If the input signal Se has a pulse width d, the sampled signal then includes n pulses of clock signals H.

This sampled signal Se is applied to the clock signal input CK of an asynchronous counter 2 followed by a detection circuit 3 to ascertain that the counting of the samples reaches a determined number n0. This detection circuit 3 generates a detection signal Sd when the number n0 is reached, to activate the transmission of a pulse with a calibrated duration dc. The circuit 4 for the transmission of this pulse with a calibrated duration as a filtered signal Sf will preferably be a synchronous counter. In the example, this circuit 4 receives the clock signal H as the counting clock signal.

It will be recalled that a counter includes several cascade-connected flip-flop circuits, each flip-flop circuit providing a stage of the counter. The output of each stage represents a bit of the counter. In a synchronous counter, the stages receive the same clock signal.

In an asynchronous counter, the stages are not controlled by the same clock. The first stage receives a clock signal CK, the second stage receives, as a clock signal, the output of the previous stage, and so on and so forth. In general, the clock signal of an n ranking stage is none other than the output of the n-1 ranking stage.

In the invention, the sampled signal Se is the signal applied as a clock signal of the asynchronous counter 2 (it is understood that this is the clock signal of the first stage). The asynchronous counter may thus count the samples contained in the width d of the pulse of the input signal Sin. By comparing the contents of the asynchronous counter 2 with the determined value n0, it is ascertained whether the pulse has a width greater than or equal to the cutoff (or filtering) value. The asynchronous counter must be reset for each new pulse that appears on the input signal Sin.

The synchronous counter 4 for its part is sized to send out a pulse with a calibrated width dc at the output, corresponding to nc clock strokes H. It is activated and reset when an input pulse is detected as having sufficient width (Sd) and deactivated as soon as it has sent out the calibrated pulse at output Sf.

With a method of this kind the filtering is invariant with the amplitude of the input pulses, the manufacturing method and the ambient temperature at which the electronic circuit works. There are only two operating zones, demarcated by the cutoff value set up by the detection value n0. These two zones each correspond to a well determined operation. Thus, all the problems encountered with a more standard (RC type) filtering operation are resolved.

Figure 3:
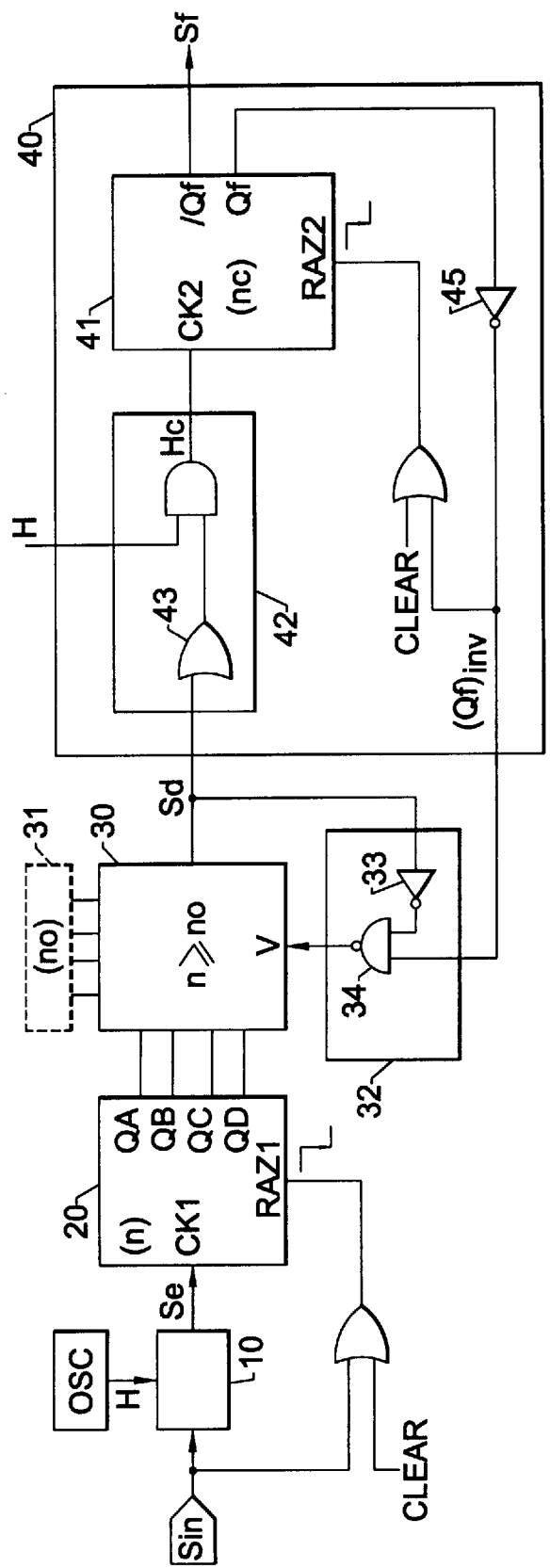
FIG. 3 shows a detailed diagram of an embodiment of the invention.
Figure 4:
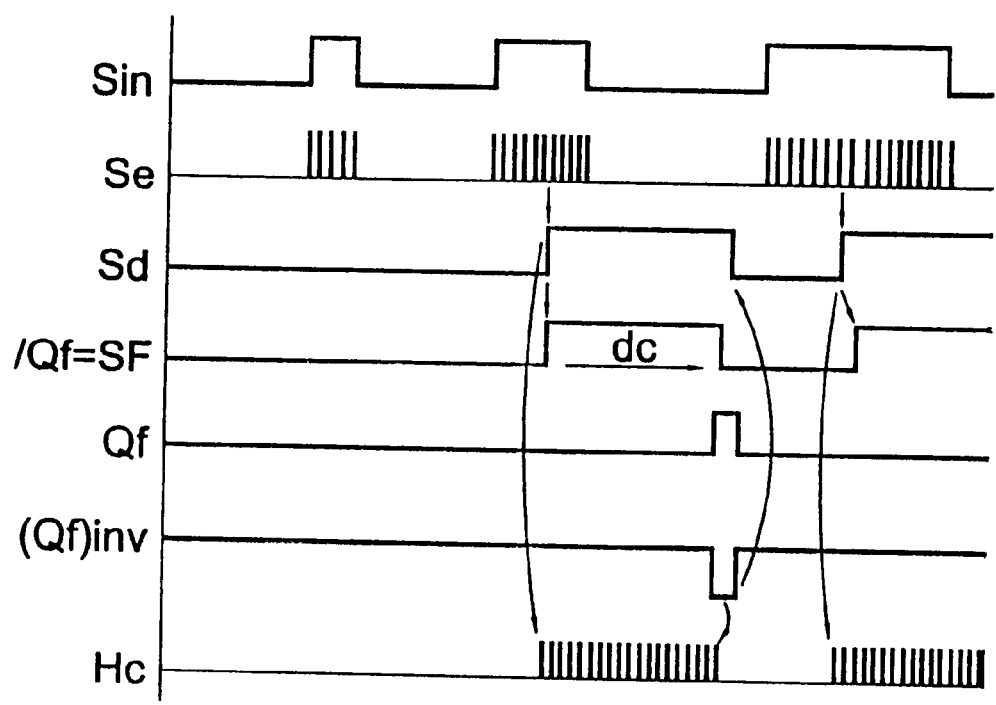
FIG. 4 shows a timing diagram of the corresponding signals.

FIG. 3 shows a detailed diagram of an embodiment of a device according to the invention. FIG. 4 shows the timing diagram of the signals corresponding to this diagram. The input pulse signal Sin is applied to an input of a sampling device 10 receiving a stabilized clock signal H. The sampled signal Se is applied to the clock signal input CK1 of an asynchronous counter 20. This counter has a resetting input RAZ1 that is active on a trailing edge and delivers its contents at output QA, QB, QC, QD each representing one bit of the counter, respectively the bits having the place value 0, 1, 2 and 3. The asynchronous counter 20 may be reset by a signal CLEAR coming from a device for the control of the electronic circuit or at each end of a pulse (trailing edge) of the input signal Sin. Thus, the counter is ready to count the number of samples of the next pulse.

The output bits from the counter are applied to the input of a detection circuit 30. This detection circuit has the function of ascertaining whether the contents of the counter are equal to or greater than a determined number n0.

This detection can be done by the decoding of the output bits from the counter. For example, if n0=8, it is enough to decode (QD=1) to know that the contents of the counter are greater than or equal to this determined number n0. This detection may be furthermore done by a comparator which then receives the value n0 to be compared from a register 31 (shown in dashes in the figure) of the electronic circuit. This approach is more flexible since it enables the programming of the comparison value.

If the counting by the asynchronous counter 20 reaches the determined value n0, the output Sd of the detection circuit 30 goes to an active level, 1 in the example. The active level of the signal Sd is then used to deactivate the detection circuit by means of a logic circuit 32. Indeed, in the example, it is necessary to hold Sd at 1 so long as the calibrated pulse has not been sent out at output Sf.

The logic circuit 32 thus dictates an inactive level, the level 1 in the example, on a signal V for the enabling of the detection circuit 30 when the signal Sd goes to its active level. The disabling of the detection circuit 30 has the effect of isolating the output Sd from the inputs. In this way, the asynchronous counter 20 can be reset for a new pulse and/or continue to count, the output Sd will remain unchanged at its active level 1.

The logic circuit 32 also makes it possible to again dictate an active level 0 to reactivate the detection circuit 30 when the calibrated pulse has been sent out at output Sf. Indeed, when the calibrated pulse has been sent out at output Sf, the detection circuit may take account of the new contents of the counter. To carry out these functions of disabling/reactivation, the logic circuit 32 in one example includes an inverter 33 to invert the signal Sd and an XNOR gate receiving, at input, the reverse signal /Sd and a signal referenced (Qf)inv indicating, in the 0 state, that the pulse with calibrated duration has been sent out at output Sf.

The detection signal Sd is applied to a circuit 40 for the transmission of a calibrated pulse with a width (duration) dc. In the example, this transmission circuit 40 has a synchronous counter 41. The device uses the two output complementary bits Qf and /Qf of this synchronous counter 41, from the f order stage, corresponding to the counting of nc pulses of clock signals. In addition, nc pulses of clock signals H correspond to the calibrated width do of the pulses obtained at output Qf and /Qf.

This synchronous counter 41 is reset by a trailing edge at the input RAZ2, which appears in the signal CLEAR or in the signal for the end of the generation of the calibrated pulse (Qf)inv. This synchronous counter 41 receives a counting clock signal Hc at its clock input CK2. This counting clock signal is given by a set 42 of logic gates, from the clock signal H.

Indeed, this clock signal H must be applied as a counting clock signal Hc as soon as the signal Sd goes to 1, the counter 41 being in a reset state, and must no longer be applied once the calibrated pulse has been sent out, as is clearly shown in FIG. 4. In the example shown, the signal already seen, referenced (Qf)inv, and the signal Sd are applied at the input of an XNOR gate 43 to give a counting signal Sdc. This signal Sdc is applied with the clock signal H as an input of an AND gate 44 to give the counting clock signal Hc.

The filtered output signal Sf is then given by the complementary bit /Qf of the f ranking stage of the counter. The leading edge of the calibrated pulse of the counter appears with the first counting clock signal pulse and the trailing edge of the calibrated pulse of the counter appears with the $nc^{th}$ counting clock signal Hc pulse.

The bit Qf of the counting clock signal is such that it remains at zero for the $nc^{th}$ first pulses and rises to 1 (leading edge) with the $nc+1^{th}$ counting clock signal Hc pulse. It is this bit Qf that is used to generate the signal for the end of generation of calibrated pulses, this signal being referenced $(Qf)_{inv}$ and being delivered by an inverter 45. This signal $(Qf)_{inv}$ is therefore at 1 at the resetting of the synchronous counter 41 and goes to zero (trailing edge) when the bit Qf goes to 1. It is this passage to zero of the signal $(Qf)_{inv}$ that is used in the device to revalidate the signal V to enable the detection circuit (logic circuit 32) and to stop the counting clock signal Hc.

It will be noted that the signal Sd cannot be used to stop the counting clock signal Hc for, when the detection circuit is re-enabled by the signal $(Qf)_{inv}$, the detection circuit takes the current contents of the counter which may have already taken a new pulse into account and may have gone beyond the number n0. The logic of the circuit 40 then will not perceive the passage to zero of the signal Sd and the synchronous counter therefore cannot be reset, in the absence of a detectable trailing edge on this signal. Furthermore, the output Sd can go back to zero only with the signal (Qf)inv which reactivates the detection circuit 30. The timing diagrams of signals are shown in FIG. 4.

The detailed arrangement of a filtering device according to the invention, described with reference to FIGS. 3 and 4, is only one exemplary embodiment. Other embodiments that remain within the scope of the invention can be envisaged.

That which is claimed is:

1. A device for filtering a pulse input signal comprising:
    a sampling circuit having an input receiving the pulse input signal, and having an output for delivering a sampled signal based upon the pulse input signal;
    an asynchronous counter receiving the sampled signal as a clock signal;
    a detection circuit for providing a detection signal when contents of said asynchronous counter are greater than or equal to a predetermined number; and
    a transmitting circuit for transmitting a calibrated pulse responsive to the detection signal.

2. A device according to claim 1, wherein said transmitting circuit comprises a synchronous counter.

3. A device according to claim 2, wherein said synchronous counter has a reset input responsive to a trailing edge of a reset pulse.

4. A device according to claim 1, wherein said asynchronous counter has a reset input responsive to a trailing edge of the pulse input signal.

5. A device according to claim 1, wherein said asynchronous counter has a reset input responsive to a control signal.

6. A device according to claim 1, wherein said detection circuit decodes the contents of said asynchronous counter to provide a decoded value, and compares the decoded value to a predetermined value.

7. A device according to claim 1, wherein said detection circuit further has an enabling input, and further comprising logic means connected to the enabling input for disabling said detection circuit to hold an output at an active level.

8. A device according to claim 7, wherein said logic means enables the detection circuit in response to the calibrated pulse from said transmitting circuit.

9. A device for filtering a pulse input signal comprising:
    a sampling circuit having an input receiving the pulse input signal, and having an output for delivering a sampled signal based upon the pulse input signal and a clock signal;
    an asynchronous counter receiving the sampled signal as a clock signal;
    a detection circuit for providing a detection signal when contents of said asynchronous counter are greater than or equal to a predetermined number; and
    a transmitting circuit for transmitting a calibrated pulse responsive to the detection signal, said transmitting circuit comprising a synchronous counter having a reset input responsive to a trailing edge of a reset pulse.

10. A device according to claim 9, wherein said asynchronous counter has a reset input responsive to a trailing edge of the pulse input signal.

11. A device according to claim 9, wherein said asynchronous counter has a reset input responsive to a control signal.

12. A device according to claim 9, wherein said detection circuit decodes the contents of said asynchronous counter to provide a decoded value, and compares the decoded value to a predetermined value.

13. A device according to claim 9, wherein said detection circuit further has an enabling input, and further comprising logic means connected to the enabling input for disabling said detection circuit to hold an output at an active level.

14. A device according to claim 13, wherein said logic means enables the detection circuit in response to the calibrated pulse from said transmitting circuit.

15. A method for filtering an input pulse signal comprising the steps of:
    sampling the pulse input signal based upon a clock signal;
    counting a number of clock pulses occurring during sampling of the pulse input signal;
    generating a detection signal when the number of counted clock pulses is greater than or equal to a predetermined number; and
    transmitting a calibrated pulse responsive to the detection signal when the number of counted clock pulses is greater than or equal to the predetermined number.

16. A method according to claim 15, wherein the step of transmitting comprises using a synchronous counter.

17. A method according to claim 16, further comprising the step of resetting the synchronous counter responsive to a trailing edge of a reset pulse.

18. A method according to claim 16, wherein the step of counting comprises using an asynchronous counter.

19. A method according to claim 18, wherein the step of generating the detection signal comprises the steps of decoding contents of the asynchronous counter to provide a decoded value, and comparing the decoded value to a predetermined value.

* * * * *